(12) United States Patent
Ko et al.

(10) Patent No.: US 11,342,404 B2
(45) Date of Patent: May 24, 2022

(54) ORGANIC LIGHT EMITTING DIODE DISPLAY DEVICE INCLUDING ETCH STOP LAYER

(71) Applicant: SAMSUNG DISPLAY CO., LTD., Yongin-si (KR)

(72) Inventors: Kyeong Su Ko, Hwaseong-si (KR); Joon Yong Park, Gunpo-si (KR); Gyung Min Baek, Yongin-si (KR); Hyun Min Cho, Hwaseong-si (KR); Dae Won Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/894,953

(22) Filed: Jun. 8, 2020

(65) Prior Publication Data
US 2021/0057504 A1 Feb. 25, 2021

(30) Foreign Application Priority Data
Aug. 19, 2019 (KR) .................... 10-2019-0101063

(51) Int. Cl.
*H01L 29/08* (2006.01)
*H01L 27/32* (2006.01)
(Continued)

(52) U.S. Cl.
CPC ...... *H01L 27/3276* (2013.01); *H01L 51/5206* (2013.01); *H01L 51/5221* (2013.01);
(Continued)

(58) Field of Classification Search
CPC ............ H01L 27/3276; H01L 51/5206; H01L 51/5221
See application file for complete search history.

(56) References Cited

U.S. PATENT DOCUMENTS 7,829,890 B2 11/2010 Cho et al.
2014/0139774 A1* 5/2014 Tsai ................ H01L 29/41733
349/43
(Continued)

FOREIGN PATENT DOCUMENTS

CN 1509127 6/2004
JP 2004-192935 7/2004
(Continued)

*Primary Examiner* — Phuc T Dang
(74) *Attorney, Agent, or Firm* — F. Chau & Associates, LLC

(57) ABSTRACT

An organic light emitting diode display including: a substrate; a TFT on the substrate; a planarization layer on the TFT; a pixel electrode on the planarization layer, wherein the pixel electrode includes upper and lower layers including a transparent conductive oxide and an intermediate layer including silver; an etch stop layer on the pixel electrode, wherein an upper surface of the pixel electrode is exposed by the etch stop layer; a partition on the etch stop layer, wherein the upper surface of the pixel electrode is exposed by the partition; an organic emission layer on the upper surface of the pixel electrode where the upper surface of the pixel electrode is exposed by the etch stop layer and the partition; and a common electrode on the organic emission layer and the partition, wherein the etch stop layer covers an edge and a side surface of the pixel electrode.

16 Claims, 17 Drawing Sheets

(51) Int. Cl.
*H01L 51/56* (2006.01)
*H01L 51/52* (2006.01)

(52) U.S. Cl.
CPC ........ *H01L 51/56* (2013.01); *H01L 2227/323* (2013.01); *H01L 2251/308* (2013.01)

(56) References Cited

U.S. PATENT DOCUMENTS

| | | | | |
|---|---|---|---|---|
| 2015/0108484 A1* | 4/2015 | Park | ............... | H01L 27/3248 |
| | | | | 257/71 |
| 2015/0228705 A1* | 8/2015 | Kim | ............... | H01L 27/3246 |
| | | | | 257/40 |
| 2019/0221629 A1* | 7/2019 | Tian | ............... | H01L 51/5206 |

FOREIGN PATENT DOCUMENTS

| | | |
|---|---|---|
| JP | 2006-093078 | 4/2006 |
| JP | 2006-093079 | 4/2006 |
| KR | 10-2012-0032904 | 4/2012 |
| KR | 10-1193196 | 10/2012 |
| KR | 10-1373435 | 3/2014 |
| KR | 10-2015-0090635 | 8/2015 |
| KR | 10-2019-0130705 | 11/2019 |
| KR | 10-2020-0014463 | 2/2020 |

* cited by examiner

ORGANIC LIGHT EMITTING DIODE DISPLAY DEVICE INCLUDING ETCH STOP LAYER

CROSS-REFERENCE TO RELATED APPLICATION

This application claims priority under 35 U.S.C. § 119 to Korean Patent Application No. 10-2019-001063 filed in the Korean Intellectual Property Office on Aug. 19, 2019, the disclosure of which is incorporated by reference herein in its entirety.

(a) TECHNICAL FIELD

The present invention relates to an organic light emitting diode display and a manufacturing method thereof, and more particularly to an organic light emitting diode display including a partition made of an inorganic material and a manufacturing method thereof.

(b) DESCRIPTION OF THE RELATED ART

An organic light emitting diode (OLED) display works without a backlight because it emits visible light. Thus, it can display deep black levels and can be thinner and lighter than a liquid crystal display (LCD) device. Further, the OLED display has high quality characteristics such as low power consumption, high luminance, high response speed, and the like.

In an OLED display, a pixel may include a thin film transistor and an OLED, the thin film transistor may be protected by a planarization layer, and the OLED may be partitioned by a partition. Typically, the planarization layer and the partition are made of an organic material such as a polyimide or a polyamide.

However, when the organic material is exposed to sunlight for a long time, the organic material generates gases such as carbon or oxygen, thereby deteriorating the OLED.

SUMMARY

An exemplary embodiment of the present invention provides an organic light emitting diode display including: a substrate; a thin film transistor disposed on the substrate; a planarization layer disposed on the thin film transistor; a pixel electrode disposed on the planarization layer, wherein the pixel electrode includes an upper layer and a lower layer including a transparent conductive oxide and an intermediate layer including silver; an etch stop layer disposed on the pixel electrode, wherein an upper surface of the pixel electrode is exposed by the etch stop layer; a partition disposed on the etch stop layer, wherein the upper surface of the pixel electrode is exposed by the partition; an organic emission layer disposed on the upper surface of the pixel electrode in an area where the upper surface of the pixel electrode is exposed by the etch stop layer and the partition; and a common electrode disposed on the organic emission layer and the partition, wherein the etch stop layer covers an edge and a side surface of the pixel electrode.

The partition may include an organic material.

The upper layer and the lower layer of the pixel electrode may include a poly-indium tin oxide or an indium tin oxide.

A thickness of the upper layer of the pixel electrode may be 70 Å to 120 Å.

The etch stop layer may include a compound having low reactivity with a fluorine-based gas.

The etch stop layer may include an indium gallium zinc oxide.

The planarization layer may include a polyimide, a polyamide, an acrylic resin, benzocyclobutene, or a phenol resin.

The thin film transistor may include a semiconductor layer, a gate electrode, a source electrode, and a drain electrode, and the drain electrode may be electrically connected to the pixel electrode.

An exemplary embodiment of the present invention provides an organic light emitting diode display including: a substrate; a thin film transistor disposed on the substrate; a planarization layer disposed on the thin film transistor; a pixel electrode disposed on the planarization layer, wherein the pixel electrode includes an upper layer, an intermediate layer, and a lower layer; an etch stop layer disposed on the pixel electrode to expose an upper surface of the pixel electrode; a partition disposed on the etch stop layer to expose the upper surface of the pixel electrode; an organic emission layer disposed on the upper surface of the pixel electrode, where the upper surface of the pixel electrode is exposed by the etch stop layer and the partition; and a common electrode disposed on the organic emission layer and the partition, wherein the intermediate layer of the pixel electrode includes silver, and the etch stop layer is disposed at an edge of the upper surface of the pixel electrode.

The upper layer and the lower layer of the pixel electrode may include a poly-indium tin oxide or an indium tin oxide.

The partition may include an organic material.

The etch stop layer may include a compound having low reactivity with a fluorine-based gas.

The etch stop layer may include a material having a higher etching ratio than that of the pixel electrode.

The thin film transistor may include a semiconductor layer, a gate electrode, a source electrode, and a drain electrode, and the drain electrode is electrically connected to the pixel electrode.

An exemplary embodiment of the present invention provides a manufacturing method of an organic light emitting diode display, the method including: receiving a substrate on which a planarization layer is disposed on a thin film transistor; forming a pixel electrode material layer including an upper material layer, an intermediate material layer including silver, and a lower material layer on the planarization layer; forming an etch stop material layer including a compound having low reactivity with a fluorine-based gas on the upper material layer; forming an etch stop layer by first patterning the etch stop material layer; forming a pixel electrode including an upper layer, an immediate layer, and a lower layer by patterning the pixel electrode material layer; forming an inorganic material layer for a partition on the etch stop layer; forming the partition to expose an upper surface of the etch stop layer by patterning the inorganic material layer for the partition; forming the etch stop layer to expose the upper surface of the pixel electrode by second patterning the etch stop layer; forming an organic emission layer on an exposed portion of the upper surface of the pixel electrode; and forming a common electrode on the organic emission layer and the partition.

The upper layer and the lower layer of the pixel electrode may include a poly-indium tin oxide or an indium tin oxide.

The forming of the partition may be performed by dry etching.

The etch stop layer may be formed at an edge of the pixel electrode.

The forming the etch stop layer may be performed by wet etching.

The etch stop layer may include a material having a higher etching ratio than that of the pixel electrode.

An exemplary embodiment of the present invention provides an organic light emitting diode display including: a substrate; a thin film transistor disposed on the substrate; a planarization layer disposed on the thin film transistor; a pixel electrode disposed on the planarization layer, wherein the pixel electrode includes first, second and third layers stacked in sequence, wherein the first and third layers include a transparent conductive oxide and the second layer includes silver; an etch stop layer disposed on an upper surface of the pixel electrode; a partition disposed on the etch stop layer; an organic emission layer disposed on a portion of the upper surface of the pixel electrode adjacent to the etch stop layer and the partition; and a common electrode disposed on the organic emission layer and the partition, wherein the etch stop layer covers an edge of the pixel electrode.

The etch stop layer may cover a side surface of the pixel electrode.

The partition may include an inorganic material.

The organic emission layer may be formed in a space between the partition and the etch stop layer.

The etch stop layer may be in direct contact with the planarization layer.

The organic emission layer may be in direct contact with the etch stop layer and the partition.

DETAILED DESCRIPTION OF THE EMBODIMENTS

Figure 1:
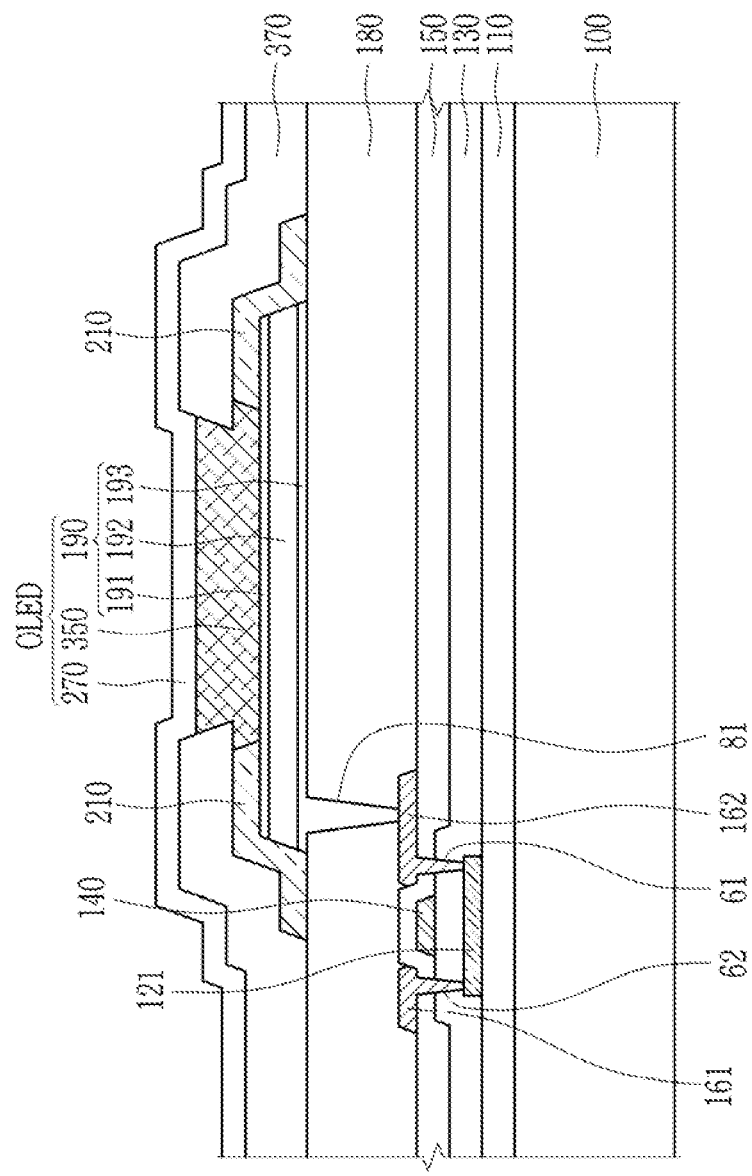
FIG. 1 illustrates a schematic cross-sectional view of an organic light emitting diode display according to an exemplary embodiment of the present invention.

Hereinafter, exemplary embodiments of the present invention will be described more fully hereinafter with reference to the accompanying drawings. As those skilled in the art would realize, the described embodiments may be modified in various different ways, and thus, should not be limited to the embodiments set forth herein.

Like numerals may refer to like or similar elements throughout the specification.

In the drawings, the thicknesses of layers, films, panels, regions, etc., may be exaggerated for clarity.

It will be understood that when an element such as a layer, film, region, or substrate is referred to as being "on" another element, it can be directly on the other element or intervening elements may also be present.

Further, in the specification, the phrase "in a plan view" may refer to when an object portion is viewed from above, and the phrase "in a cross-sectional view" may refer to when a cross-section taken by vertically cutting an object portion is viewed from the side.

Hereinafter, an organic light emitting diode display according to an exemplary embodiment of the present invention will be described with reference to FIG. 1.

FIG. 1 illustrates a schematic cross-sectional view of an organic light emitting diode display according to an exemplary embodiment of the present invention.

Referring to FIG. 1, the organic light emitting diode display according to the present exemplary embodiment may include a substrate 100, a buffer layer 110, a semiconductor layer 121, a gate insulating layer 130, a gate electrode 140, an interlayer insulating layer 150, a source electrode 161, a drain electrode 162, a planarization layer 180, a pixel electrode 190, an etch stop layer 210, an organic emission layer 350, a partition 370, and a common electrode 270. Herein, the pixel electrode 190, the organic emission layer 350, and the common electrode 270 compose a light emitting diode OLED.

The substrate 100 may be made of glass, plastic, or a polyimide (PI).

The buffer layer 110 is disposed on the substrate 100. The buffer layer 110 is used to planarize a surface of the substrate 100 and to block infiltration of impurities, and may include a silicon oxide (SiOx) or a silicon nitride (SiNx).

The semiconductor layer 121 is disposed on the buffer layer 110. The semiconductor layer 121 may be formed of an oxide semiconductor, and may include a channel region, a source region, and a drain region that are divided according to where or whether impurities are doped. The channel region is a region in which impurities are not doped, and the source region and drain region are regions in which impurities such as boron (B) or phosphorus (P) are doped.

The gate insulating layer 130 is disposed on the substrate 100 to cover the semiconductor layer 121 and the buffer layer 110. The gate insulating layer 130 is formed of an inorganic insulating layer, and may include a silicon oxide (SiOx) or a silicon nitride (SiNx).

The gate electrode 140 is disposed on the gate insulating layer 130. The gate electrode 140 may be formed of a metal material, and may include aluminum (Al), molybdenum (Mo), copper (Cu), or the like.

The interlayer insulating layer 150 is disposed on the substrate 100 to cover the gate electrode 140 and the gate insulating layer 130. The interlayer insulating layer 150 may be formed of an inorganic insulating layer including a silicon oxide (SiOx) or a silicon nitride (SiNx).

Openings 61 and 62 for exposing the source region and the drain region of the semiconductor layer 121 are formed in the interlayer insulating layer 150 and the gate insulating layer 130. The source electrode 161 and the drain electrode 162 disposed on the interlayer insulating layer 150 are connected to the source region and the drain region of the semiconductor layer 121 by the openings 61 and 62, respectively. Accordingly, the semiconductor layer 121, the gate electrode 140, the source electrode 161, and the drain electrode 162 compose a thin film transistor (TFT).

The planarization layer 180 is disposed on the source electrode 161 and the drain electrode 162. The planarization layer 180 is disposed on the substrate 100 to cover the source electrode 161, the drain electrode 162, and the interlayer insulating layer 150. The planarization layer 180, which is used to planarize the surface of the substrate 100 including the TFT, may be formed of an organic insulating layer including one or more materials of a polyimide, a polyamide, an acrylic resin, benzocyclobutene, and a phenol resin.

The pixel electrode 190 is disposed on the planarization layer 180. The pixel electrode 190 has a multilayer structure including a transparent conductive oxide film, a metal material, and a transparent conductive oxide film.

The pixel electrode 190 according to the present exemplary embodiment includes an upper layer 191 made of a transparent conductive oxide film, a lower layer 193 made of a transparent conductive film, and an intermediate layer 192 made of a metal material. The upper layer 191 may be made of a transparent conductive material, to transmit light generated from the organic light emitting diode OLED, and the intermediate layer 192 and the lower layer 193 may serve as reflective layers. The upper layer 191 may have a thickness of 100 Å or less, the intermediate layer 192 may have a thickness of 700 Å to 1000 Å, and the lower layer 193 may have a thickness of 70 Å to 100 Å.

The transparent conductive oxide film may include an indium tin oxide (ITO), a poly-ITO, an indium zinc oxide (ZO), an indium gallium zinc oxide (ICZO), and an indium tin zinc oxide (ITZO), and the metal material may include silver (Ag), molybdenum (Mo), copper (Cu), gold (Au), and aluminum (Al). The upper layer 191 of the pixel electrode 190 according to the present exemplary embodiment includes an ITO or a poly-ITO, the intermediate layer 192 includes silver (Ag), and the lower layer 193 may include an ITO or a poly-ITO. However, in some exemplary embodiments of the present invention, the upper layer 191 and the lower layer 193 may include various transparent conductive oxides, and the intermediate layer 192 may include various metal materials.

An opening 81 exposing the drain electrode 162 is formed in the planarization layer 180, and the drain electrode 162 and the pixel electrode 190 are connected through the opening 81. For example, the lower layer 193 of the pixel electrode 190 is connected to the drain electrode 162 through the opening 81.

The etch stop layer 210 is disposed on the pixel electrode 190 and the planarization layer 180. For example, the etch stop layer 210 is disposed to cover an edge and a side surface of the pixel electrode 190 to expose a portion of the upper surface of the pixel electrode 190. For example, the portion of the upper surface of the pixel electrode 190 may be exposed by a space between the etch stop layer 210 disposed on opposite edges of the upper surface of the pixel electrode 190. The etch stop layer 210 may have a thickness of about 400 Å to 800 Å.

The etch stop layer 210 may be formed to cover the edge and the side surface of the pixel electrode 190, thereby preventing a dry etching gas from reacting with the silver Ag of the pixel electrode 190 and protecting the pixel electrode 190. Characteristics of the etch stop layer 210 will be described in detail in the dry etching process of forming the partition in FIG. 6 and FIG. 14 to be described later.

The etch stop layer 210 may include a compound having low reactivity with a fluorine (F)-based gas. For example, the etch stop layer 210 may include a compound such as an indium zinc oxide (IZO), $ZrCl_4$, $ZrBr_4$, $HfCl_4$, $HfBr_4$, $HgCl_2$, $HgBr_2$, $Al_2Cl_6$, $Al_2Br_6$, $(GaCl_3)_2$, $GaBr_3$, $YBr_2$, or $FeBr_6$, or Li, Na, Ka, Rb, Cs, Be, Mg, Ca, Sr, Ba, Sc, La, Mn, Co, Rh, Ni, Cu, Ag, Au, Zn, Cd, In, Ti, or Bi.

The partition 370 is disposed on the etch stop layer 210. The partition 370 is disposed to cover the edge and the side surface of the etch stop layer 210 and to cover the planarization layer 180 such that a portion of the upper surface of the pixel electrode 190 is exposed. The partition 370 may completely overlap the etch stop layer 210. The partition 370 may partition a formation position of the organic emission layer 350 such that the organic emission layer 350 can be formed at the exposed portion of the upper surface of the pixel electrode 190.

According to the present exemplary embodiment, the partition 370 is made of an inorganic material including a silicon nitride (SiNx). The partition 370 is made of an inorganic material, to block a path of gases (e.g., carbon (C), oxygen ($O_2$), and carbon monoxide (CO)) generated in the planarization layer 180, which is made of an organic material, from being introduced into the organic emission layer 350 when the display device is exposed to sunlight for a long time. Accordingly, the partition 370 made of an inorganic material may prevent the OLED from deteriorating.

The organic emission layer 350 is disposed in an opening defined by the partition 370. Although the organic emission layer 350 is illustrated as a single layer in FIG. 1, it is to be understood that an auxiliary layer such as an electron injecting layer, an electron transporting layer, a hole transporting layer, or a hole injecting layer may also be included above and below the organic emission layer 350.

The common electrode 270 is disposed on the partition 370 and the organic emission layer 350. The common electrode 270 may be formed of a transparent conductive layer, including an indium tin oxide (ITO), an indium zinc oxide (ZO), an indium gallium zinc oxide (IGZO), an indium tin zinc oxide (ITZO), etc.

Hereinafter, a manufacturing method of an organic light emitting diode display according to an exemplary embodiment of the present invention will be described with reference to FIG. 2 to FIG. 8.

FIG. 2 to FIG. 8 illustrate cross-sectional views for describing a manufacturing method of an organic light emitting diode display according to an exemplary embodiment of the present invention.

Figure 2:
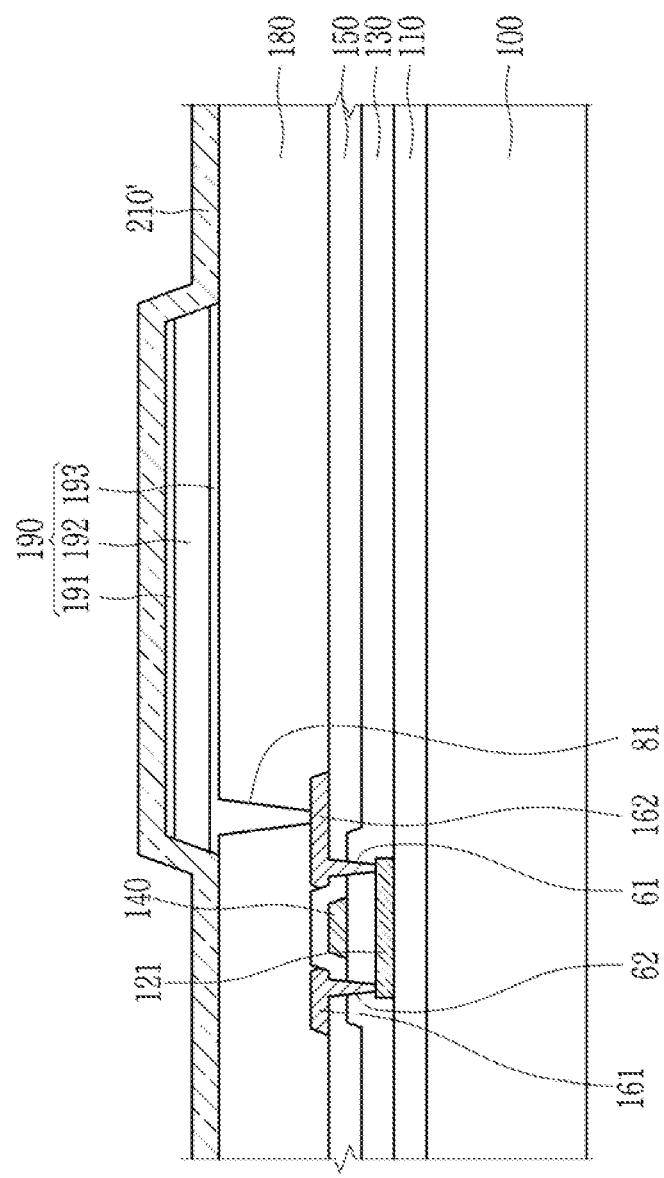
FIGS. 2, 3, 4, 5, 6, 7 and 8 illustrate cross-sectional views for describing a manufacturing method of an organic light emitting diode display according to an exemplary embodiment of the present invention.

Referring to FIG. 2, the pixel electrode 190 including the upper, intermediate and lower layers 191, 192, and 193, the TFT, and the planarization layer 180 are disposed on the substrate 100, and an etch stop material layer 210' is formed on the pixel electrode 190 and the planarization layer 180. For example, the etch stop material layer 210' is formed directly on the pixel electrode 190 and the planarization layer 180.

The upper layer 191 of the pixel electrode 190 includes ITO or poly-ITO, the intermediate layer 192 of the pixel electrode 190 includes silver (Ag), and the lower layer 193 of the pixel electrode 190 includes ITO or poly-ITO. According to an exemplary embodiment of the present invention, the upper layer 191 and the lower layer 193 may be formed of various transparent conductive oxides, and the intermediate layer 192 may be formed of various metal materials.

For example, the etch stop material layer 210' may include a compound having low reactivity with a fluorine (F)-based gas, e.g., a compound such as an indium zinc oxide (IZO), $ZrCl_4$, $ZrBr_4$, $HfCl_4$, $HfBr_4$, $HgCl_2$, $HgBr_2$, $Al_2Cl_6$, $Al_2Br_6$, $(GaCl_3)_2$, $GaBr_3$, $YBr_2$, or $FeBr_6$, or Li, Na, Ka, Rb, Cs, Be, Mg, Ca, Sr, Ba, Sc, La, Mn, Co, Rh, Ni, Cu, Ag, Au, Zn, Cd, In, Ti, or Bi. The etch stop material layer 210' may be formed into an etch stop layer 210 by an etching process.

Figure 3:
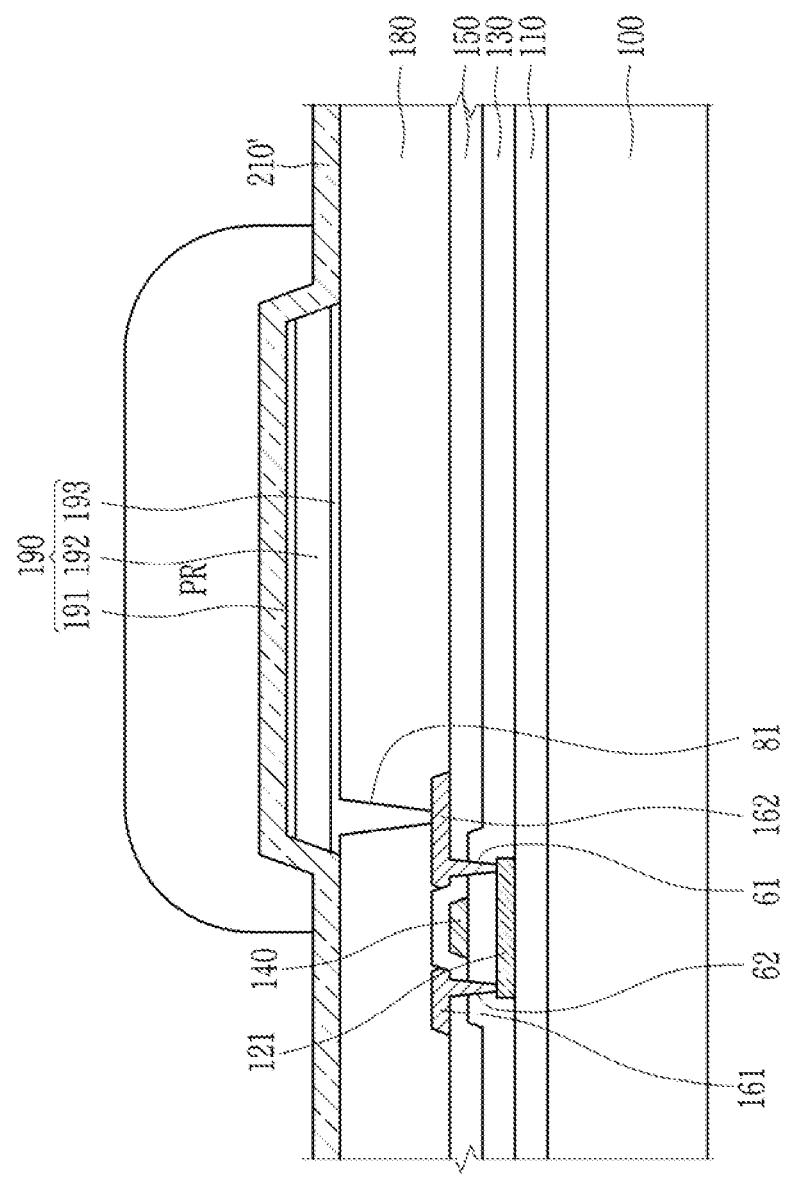

Referring to FIG. 3, a photoresist (PR) pattern is formed on the etch stop material layer 210'.

The photoresist (PR) pattern is formed over a wider area than a region covered by the pixel electrode 190 when viewed in a direction perpendicular to the substrate 100, and the etch stop material layer 210' is first patterned by a photolithography process or the like. Such first patterning includes patterning opposite ends of the etch stop material layer 210' by a wet etching.

Figure 4:
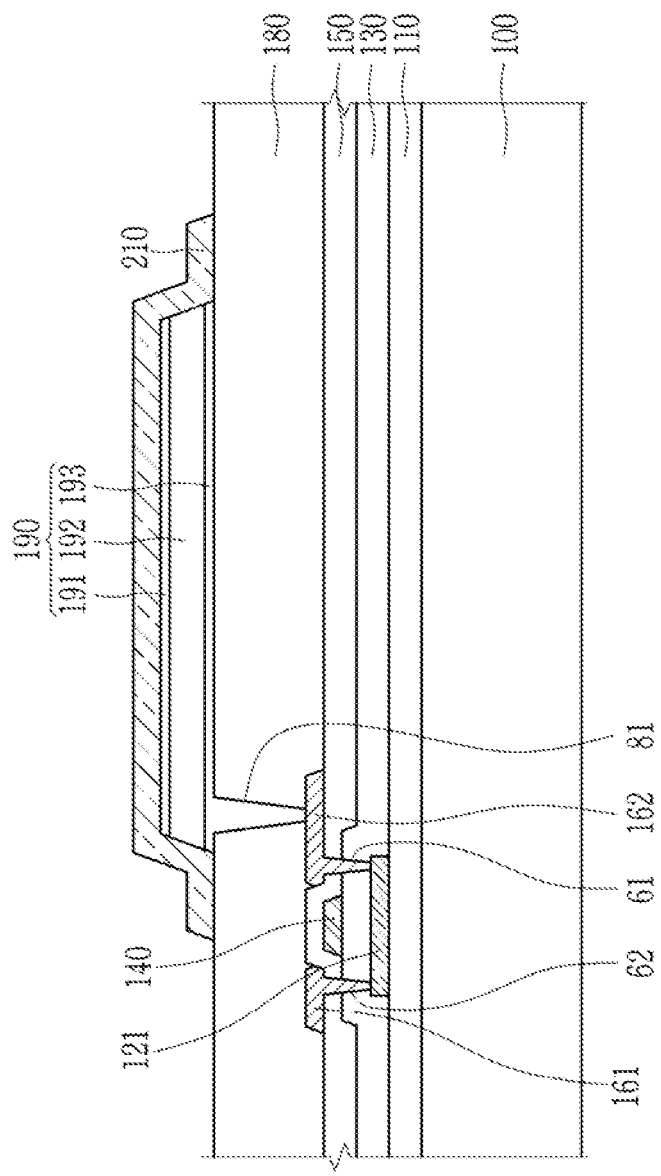

Referring to FIG. 4, the photoresist (PR) pattern is removed, and the etch stop layer 210 is formed to cover both the upper and side surfaces of the pixel electrode 190. In other words, the etch stop layer 210 completely overlaps the pixel electrode 190.

The lower layer 193 of the pixel electrode 190 is in contact with the upper surface of the planarization layer 180. In a subsequently formed organic light emitting diode display, a portion where the pixel electrode 190 and the planarization layer 180 contact each other may affect electrical and light emitting characteristics of the organic light emitting diode display. To prevent this, in the present exemplary embodiment, the etch stop layer 210 may be first patterned, followed by a heat treatment process to transform the upper layer 191 and the lower layer 193 of the pixel electrode 190 into poly-ITO. In this case, a bonding property of the portion where the planarization layer 180 and the pixel electrode 190 contact each other may be improved.

Figure 5:
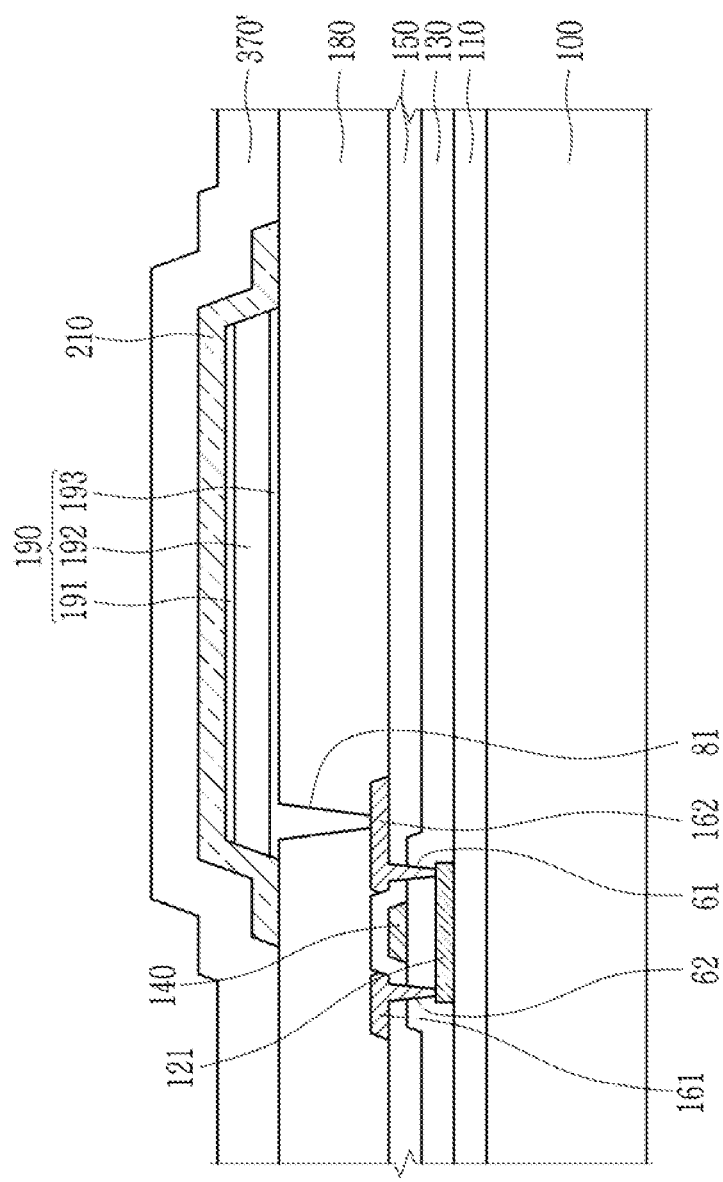

Referring to FIG. 5, an inorganic material layer 37' for a partition is formed on the etch stop layer 210 and the planarization layer 180.

The inorganic material layer 370' may be made of a silicon nitride (SiNx) or the like. The partition 370 formed thereafter includes an inorganic material, to prevent the OLED from deteriorating as gases (e.g., carbon (C), oxygen (O2), and carbon monoxide (CO)) generated in the planarization layer 180, which is made of an organic material, are introduced into the organic emission layer 350.

Figure 6:
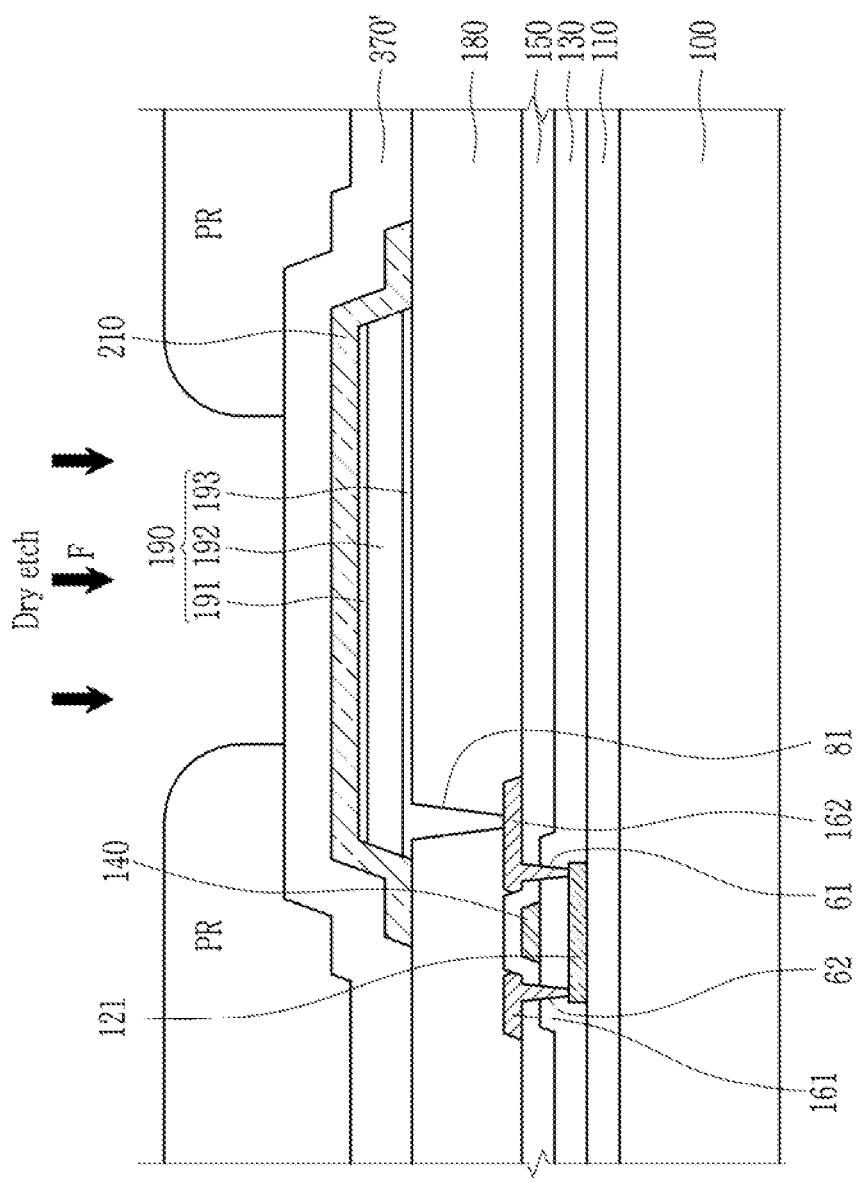

Referring to FIG. 6, a photoresist (PR) pattern is formed on the inorganic material layer 370' for the partition. The photoresist (PR) pattern is formed at a position overlapping an edge portion of the etch stop layer 210.

The partition 370 is formed by dry etching the inorganic material layer 370' for the partition depending on the photoresist (PR) pattern. Such dry etching process may be performed in a vacuum chamber, and an etching gas such as sulfur hexafluoride ($SF_6$), nitrogen trifluoride ($NF_3$), or argon (Ar) may be used.

In an organic light emitting diode display according to a comparative example, which does not include the etch stop layer 210 of the present invention, since the upper layer of the pixel electrode 190 is formed to have a thickness of 70 Å to 120 Å, particles or fine gaps may be formed in the upper layer. In this case, when the particles and the like are exposed to the dry etching gas, silver (Ag) in the intermediate layer of the pixel electrode 190 reacts with the etching gas to form silver oxide ($Ag_2O$), silver fluoride (AgF), or the like, and silver oxide ($Ag_2O$), silver fluoride (AgF), or the like is included in the intermediate layer. Therefore, the electrical and light emitting characteristics of the organic light emitting diode display of the comparative example deteriorate.

However, since the pixel electrode 190 according to the present exemplary embodiment is covered by the etch stop layer 210, the pixel electrode 190 is not affected by the etching gas. In addition, since the etch stop layer 210 is formed of a compound having low reactivity with the etching gas, the etch stop layer 210 is not affected by the dry etching process.

Therefore, in the present exemplary embodiment, by including the etch stop layer 210, it is possible to prevent damage to the pixel electrode 190 in the dry etching process of forming the partition 370 and to prevent the electrical and light emitting characteristics of the organic light emitting diode display from deteriorating.

Figure 7:
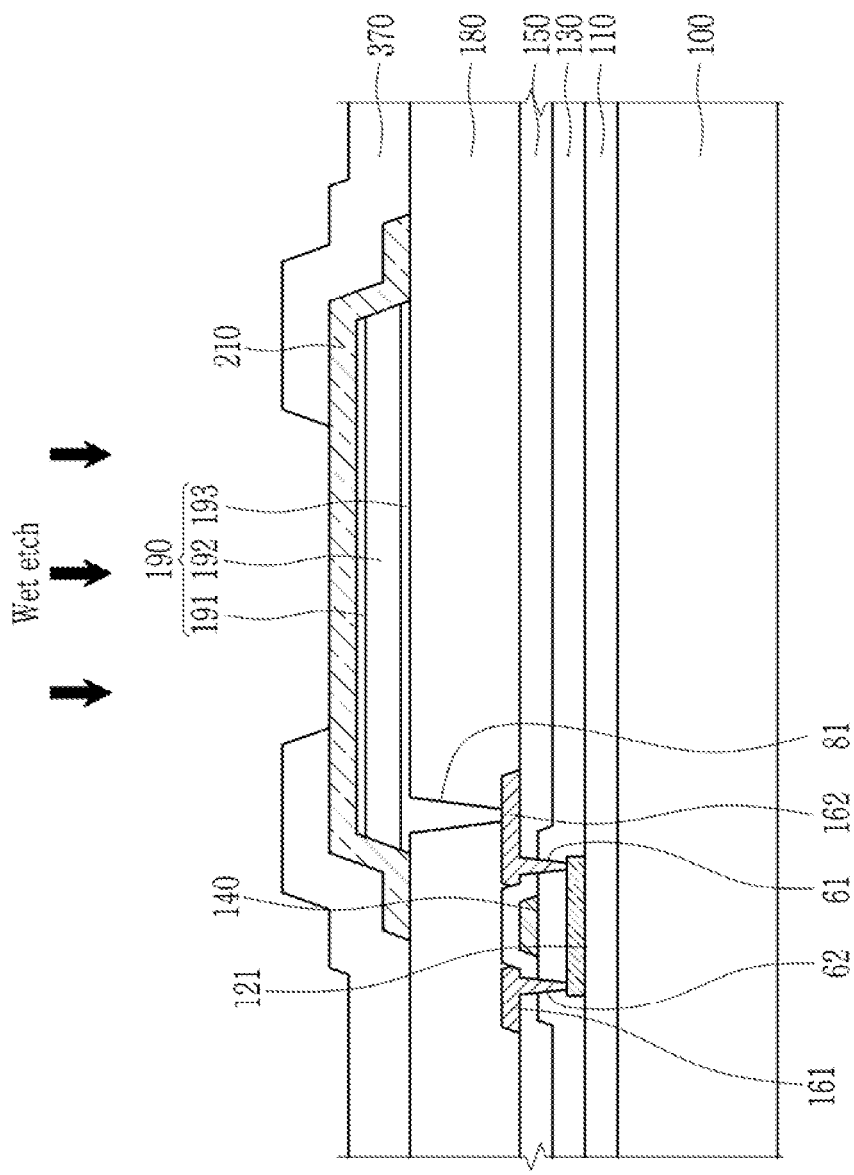

Referring to FIG. 7, the partition 370 is formed in the organic light emitting diode display to expose a portion of the upper surface of the etch stop layer 210.

Thereafter, a wet etching is performed to second pattern the etch stop layer 210. The etch stop layer 210 is patterned to expose a portion of the upper surface of the pixel electrode 190. Since the etch stop layer 210 includes a material having higher etching selectivity than that of the pixel electrode 190, only a portion of the upper surface of the etch stop layer 210 may be etched by the etchant. In addition, after the fourth step of FIG. 4, since the pixel electrode 190 including poly-ITO is also formed of a material having lower etching selectivity than that of the etch stop layer 210 by the heat treatment process, only the etch stop layer 210 is etched by the wet etching process.

It can be seen that the pixel electrode 190 is not etched in the wet etching process, through Table 1 below.

Table 1 shows an etching ratio of the metal materials at 45° C.

TABLE 1

| Etchant | Temp (° C.) | IGZO (A/s) | IZO (A/s) | a-ITO (A/s) | Poly-ITO (A/s) | Ag (A/s) |
| --- | --- | --- | --- | --- | --- | --- |
| A | 45 | 20 | 75 | 15 | 0 | 0 |

Referring to Table 1, in the wet etching process using an etchant A at 45° C., IGZO, IZO, and amorphous (a-ITO) are partially etched, but poly-ITO and Ag maintain the etch rate of 0. In other words, the pixel electrode 190 according to the present exemplary embodiment includes poly-ITO in the upper layer 191 and the lower layer 193 and silver (Ag) in the intermediate layer 192 thereby preventing the etching of the pixel electrode 190.

Figure 8:
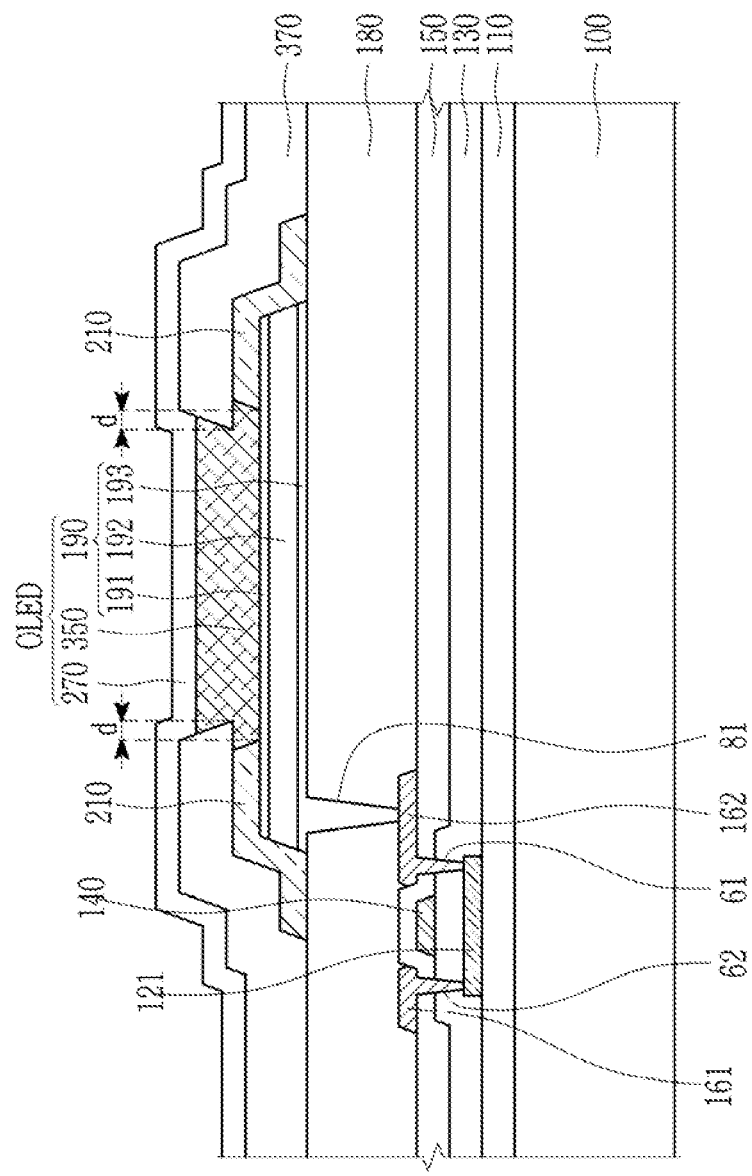

Referring to FIG. 8, as the etch stop layer 210 is etched, the organic emission layer 350 is disposed on the exposed upper surface of the pixel electrode 190, and the common electrode 270 is disposed on the organic emission layer 350 and the partition 370.

In the process of etching the etch stop layer 210 of FIG. 8, the edge of the partition 370 is etched to protrude more than the etch stop layer 210. In other words, the edge of the partition 370 extends beyond the etch stop layer 210 into the area wherein the organic emission layer 350 is formed. A distance d from one edge of the partition 370 to a first end of the etch stop layer 210 may be 0.2 μm. In this case, the organic emission layer 350 may be flatly deposited since the edge of the partition 370 is formed to protrude more than the edge of the etch stop layer 210.

Hereinafter, an organic light emitting diode display according to another exemplary embodiment of the present invention will be described with reference to FIG. 9.

Figure 9:
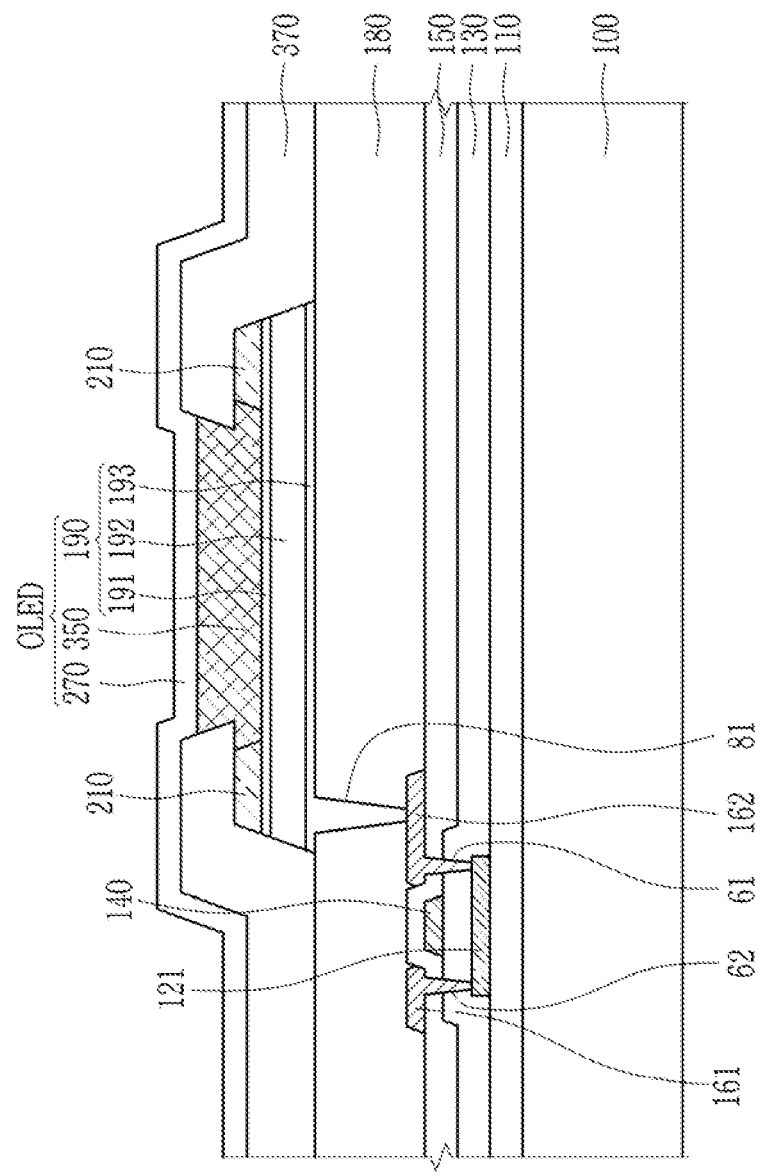
FIG. 9 illustrates a schematic cross-sectional view of an organic light emitting diode display according to another exemplary embodiment of the present invention.

FIG. 9 illustrates a schematic cross-sectional view of an organic light emitting diode display according to another exemplary embodiment of the present invention.

Referring to FIG. 9, the organic light emitting diode display according to the present exemplary embodiment may include a substrate 100, a buffer layer 110, a semiconductor layer 121, a gate insulating layer 130, a gate electrode 140, an interlayer insulating layer 150, a source electrode 161, a drain electrode 162, a planarization layer 180, a pixel electrode 190, an etch stop layer 210, an organic emission layer 350, a partition 370, and a common electrode 270.

Herein, the pixel electrode 190, the organic emission layer 350, and the common electrode 270 compose an OLED.

The display device illustrated in FIG. 9 is similar in structure to most of the display device illustrated in FIG. 1. For example, the display device of FIG. 9 differs from that of FIG. 1 in the formation position of the etch stop layer 210, and thus, the following description will focus on the etch stop layer 210.

The etch stop layer 210 is disposed at an edge of the pixel electrode 190 except for the exposed portion of the upper surface of the pixel electrode 190. In other words, an end of the pixel electrode 190 and an end of the etch stop layer 210 may be positioned on a same surface. The etch stop layer 210 may have a thickness of about 400 Å to 800 Å.

An etched surface of the etch stop layer 210 may be formed to have a boundary that coincides with etched surfaces of the upper layer 191, the intermediate layer 192, and the lower layer 193 of the pixel electrode 190. Additionally, the etched surface of the etch stop layer 210 may be formed to be positioned inside the boundary of the etched surface of the pixel electrode 190 such that the etched surface of the etch stop layer 210 does not coincide with the etched surfaces of the upper layer 191, the intermediate layer 192, and the lower layer 193 of the pixel electrode 190.

The etch stop layer 210 may include a compound having low reactivity with a fluorine (F)-based gas. For example, the etch stop layer 210 may include a compound such as an indium zinc oxide, $ZrCl_4$, $ZrBr_4$, $HfCl_4$, $HfBr_4$, $HgCl_2$, $HgBr_2$, $Al_2Cl_6$, $Al_2Br_6$, $(GaCl_3)_2$, $GaBr_3$, $YBr_2$, or $FeBr_6$ or Li, Na, Ka, Rb, Cs, Be, Mg, Ca, Sr, Ba, Sc, La, Mn, Co, Rh, Ni, Cu, Ag, Au, Zn, Cd, In, Ti, or Bi.

Therefore, the etch stop layer 210 may be disposed at the edge of the pixel electrode 190 to include a compound having low reactivity with the fluorine (F)-based gas, thereby preventing a dry etching gas from reacting with the silver Ag of the pixel electrode 190 and protecting the pixel electrode 190 in the dry etching process.

Hereinafter, a manufacturing method of an organic light emitting diode display according to another exemplary embodiment of the present invention will be described with reference to FIG. 10 to FIG. 17.

FIG. 10 to FIG. 17 illustrate cross-sectional views for describing a manufacturing method of an organic light emitting diode display according to another exemplary embodiment of the present invention.

Figure 10:
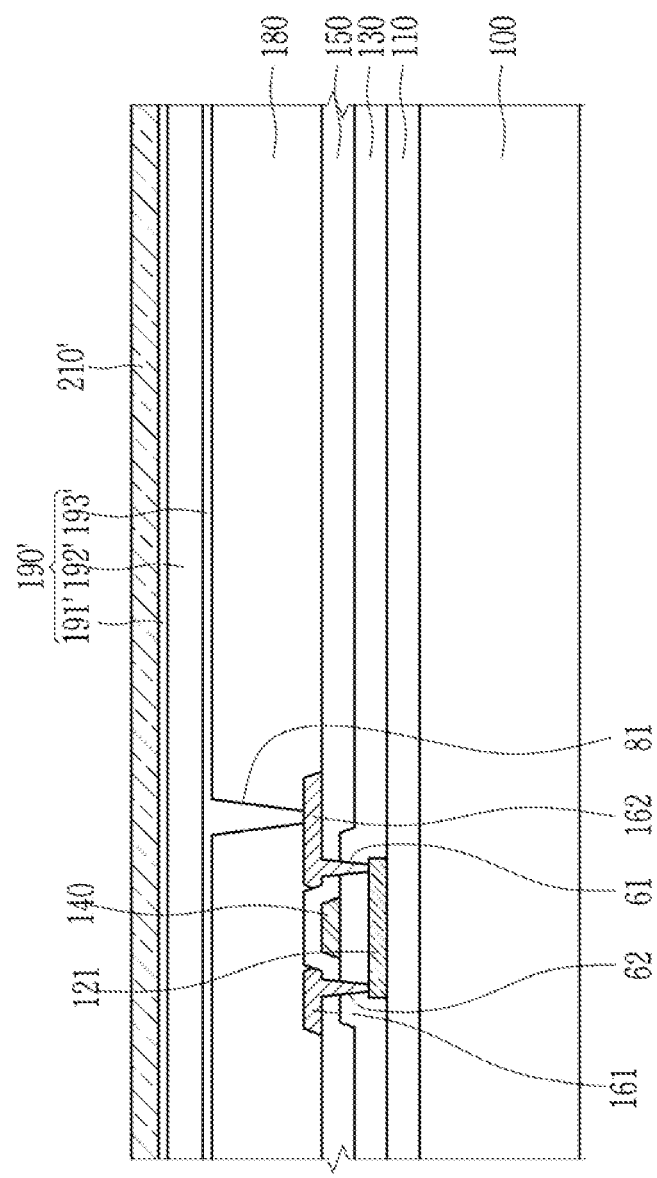
FIGS. 10, 11, 12, 13, 14, 15, 16 and 17 illustrate cross-sectional views for describing a manufacturing method of an organic light emitting diode display according to another exemplary embodiment of the present invention.

Referring to FIG. 10, a thin film transistor and a planarization layer 180 are disposed on the substrate 100, and a pixel electrode material layer 190' and an etch stop material layer 210' are disposed on the planarization layer 180.

An upper material layer 191' of the pixel electrode material layer 190' includes ITO or poly-ITO, an intermediate material layer 192' of the pixel electrode material layer 190' includes silver (Ag), and a lower material layer 193' of the pixel electrode material layer 190' includes ITO or poly-TO. According to an exemplary embodiment of the present invention, the upper material layer 191' and the lower material layer 193' may be formed of various transparent conductive oxides, and the intermediate material layer 192' may be formed of various metal materials.

For example, the etch stop material layer 210' may include a compound having low reactivity with a fluorine (F)-based gas, e.g., a compound such as an indium zinc oxide, $ZrCl_4$, $ZrBr_4$, $HfCl_4$, $HfBr_4$, $HgCl_2$, $HgBr_2$, $Al_2Cl_6$, $Al_2Br_6$, $(GaCl_3)_2$, $GaBr_3$, $YBr_2$, or $FeBr_6$, or Li, Na, Ka, Rb, Cs, Be, Mg, Ca, Sr, Ba, Sc, La, Mn, Co, Rh, Ni, Cu, Ag, Au, Zn, Cd, In, Ti, or Bi. The etch stop material layer 210' may be formed into an etch stop layer 210 by an etching process.

The upper material layer 191', the intermediate material layer 192', and the lower material layer 193 may compose one pixel electrode 190 by an etching process, and the etch stop material layer 210' may compose the etch stop layer 210 by the etching process.

Figure 11:
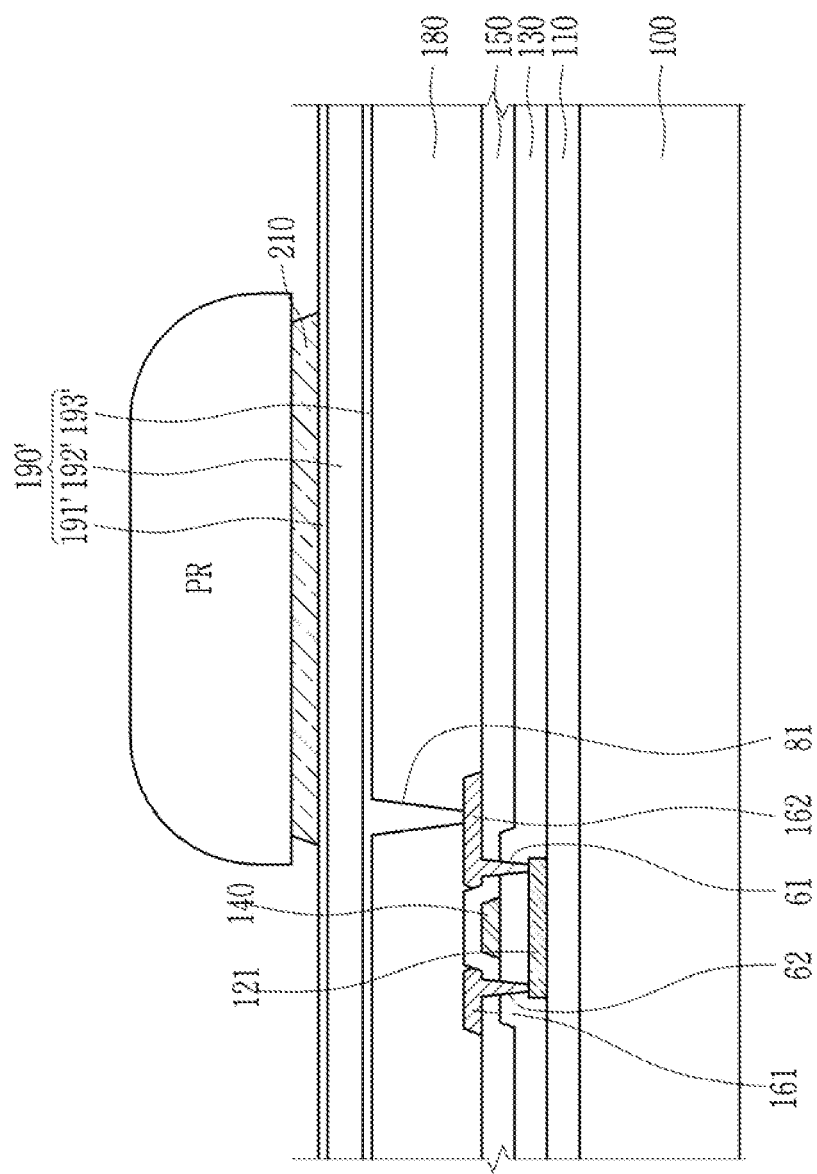

Referring to FIG. 11, the etch stop material layer 210' is patterned to form the etch stop layer 210, and the photoresist (PR) pattern for patterning the pixel electrode 190 is disposed on the etch stop layer 210.

It is to be understood that the photoresist (PR) pattern is formed on the etch stop material layer 210', and then, the etch stop layer 210 may be formed by the wet etching process.

Figure 12:
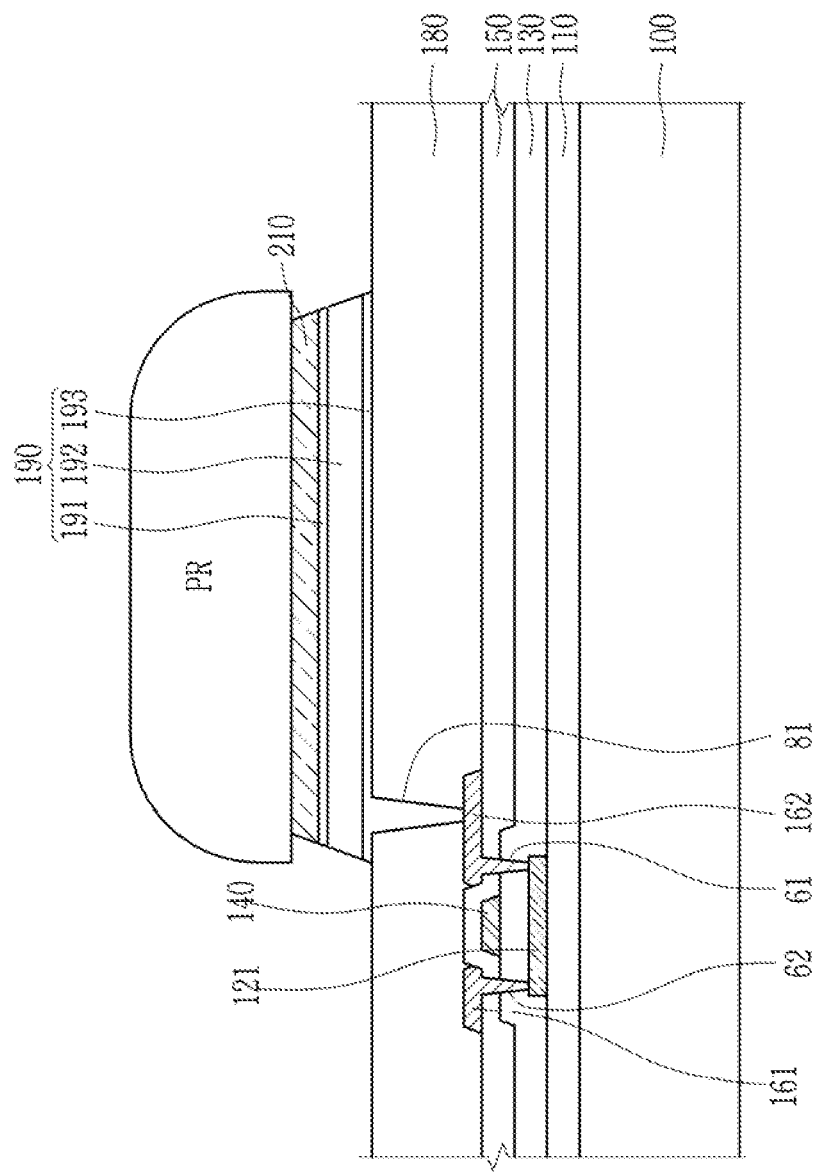

Referring to FIG. 12 the pixel electrode 190 is patterned by the photoresist (PR) pattern. Accordingly, the upper layer 191 of the pixel electrode 190 may include an indium tin oxide (ITO), the intermediate layer 192 of the pixel electrode 190 may include silver (Ag), and the lower layer 193 of the pixel electrode 190 may include an indium tin oxide (ITO).

According to an exemplary embodiment of the present invention, when the upper layer 191, the intermediate layer 192, and the lower layer 193 of the pixel electrode 190 are simultaneously etched, they may be formed such that boundaries of the etched surfaces of the respective layers coincide with each other. In other words, the boundaries of the etched surfaces of the respective layers may form an edge of the pixel electrode 190. When one layer is etched more than another layer, an undercut may be formed in the etched surface. However, since an etching degree of each layer does not have a large difference, the pixel electrode 190 may be finally formed to have a boundary of an almost similarly etched surface. In other words, the boundaries (e.g., edges) of the etched surfaces of the respective layers may be adjacent to each other.

In addition, an etched surface of the etch stop layer 210 may be formed to have a boundary that coincides with etched surfaces of the upper layer 191, the intermediate layer 192, and the lower layer 193 of the pixel electrode 190, or the etched surface of the etch stop layer 210 may be formed to be positioned inside the boundary of the etched surface of the pixel electrode 190.

Figure 13:
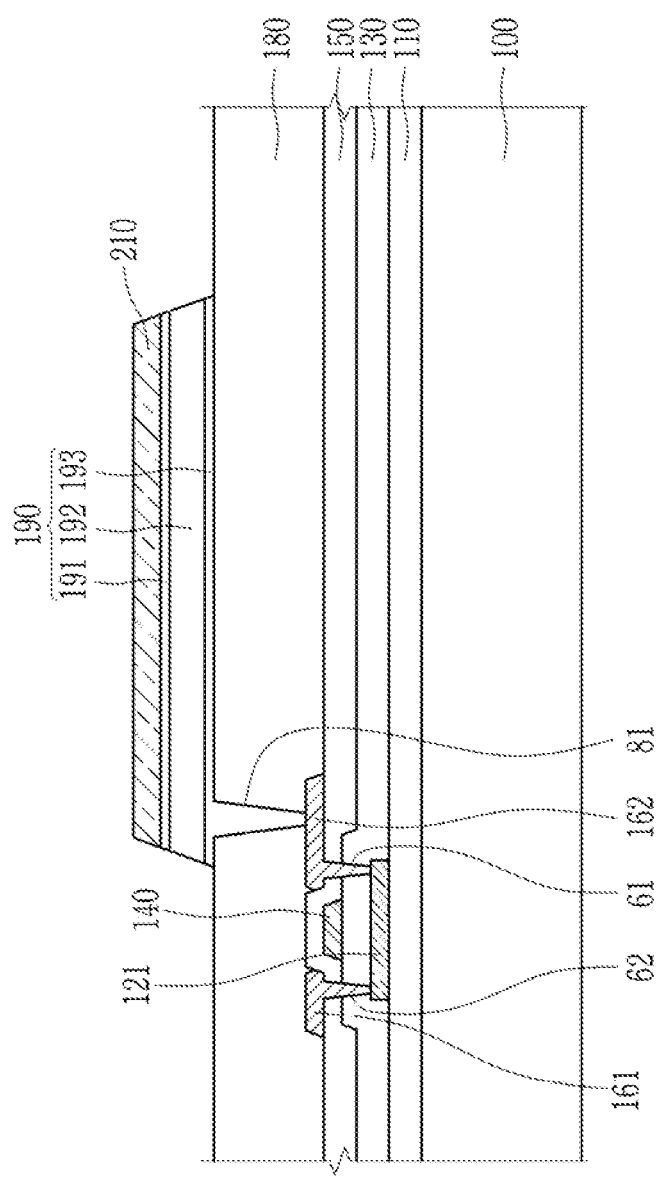

Referring to FIG. 13, a photoresist (PR) pattern is removed, and the patterned pixel electrode 190 and the etch stop layer 210 are disposed on the planarization layer 180.

The etch stop layer 210 is formed to overlap the same size and area as the pixel electrode 190, and an end of the etch stop layer 210 is formed on the same plane as an end of the pixel electrode 190. For example, the etch stop layer 210 is formed on the upper layer 191 of the pixel electrode 190.

The lower layer 193 of the pixel electrode 190 is in contact with the upper surface of the planarization layer 180. In a subsequent organic light emitting diode display, a portion where the pixel electrode 190 and the planarization layer 180 contact each other may affect electrical and light emitting characteristics of the organic light emitting diode display. To prevent this, in the present exemplary embodiment, the etch stop layer 210 may be patterned first, followed by a heat treatment process to transform the upper layer 191 and the lower layer 193 of the pixel electrode 190 into poly-ITO. Therefore, a bonding property of the portion where the planarization layer 180 and the pixel electrode 190 contact each other may be improved.

Figure 14:
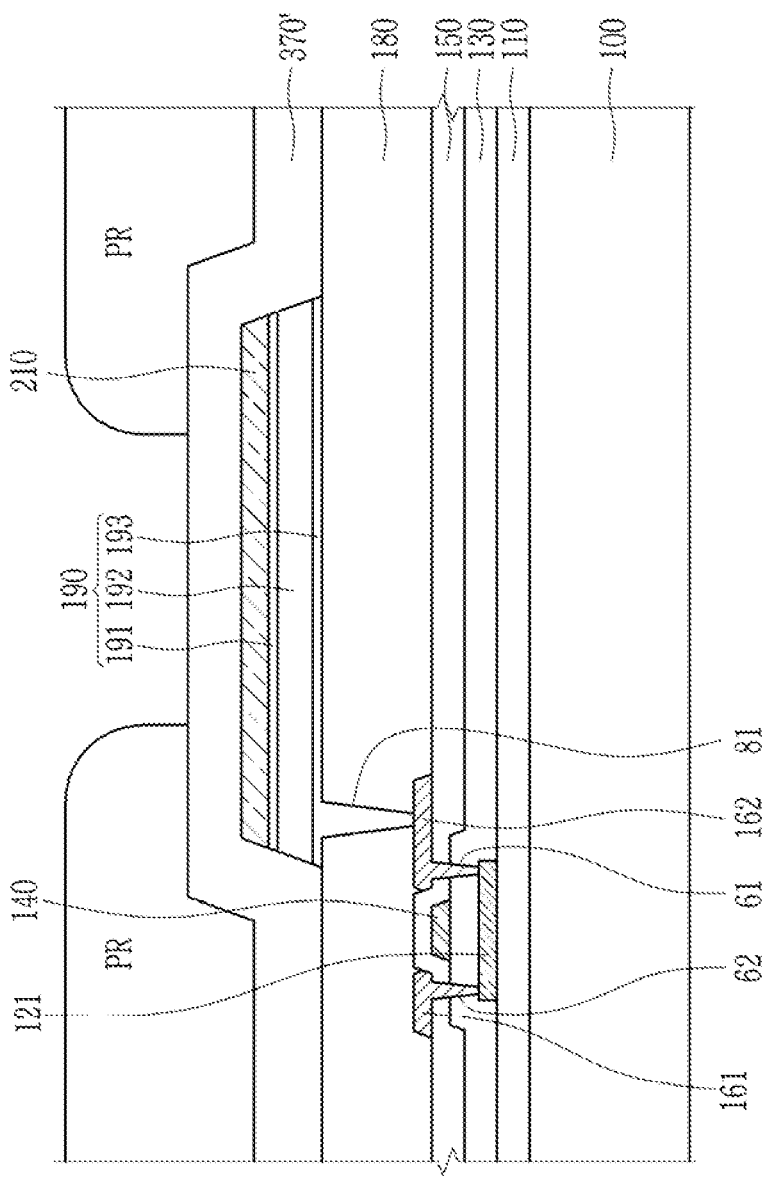

Referring to FIG. 14, an inorganic material layer 370' for the partition is formed on the etch stop layer 210 and the planarization layer 180, and a photoresist (PR) pattern is formed on the inorganic material layer 370' for the partition.

The photoresist (PR) pattern is formed at a position overlapping an edge portion of the etch stop layer 210.

The partition 370 is formed by dry etching the inorganic material layer 370' for the partition depending on the photoresist (PR) pattern. Such dry etching process may be performed in a vacuum chamber, and an etching gas such as sulfur hexafluoride ($SF_6$), nitrogen trifluoride ($NF_3$), or argon (Ar) may be used.

In an organic light emitting diode display according to a comparative example, which does not include the etch stop layer 210, since the upper layer of the pixel electrode 190 is formed to have a thickness of 70 Å to 120 Å, particles or fine gaps may be formed in the upper layer. In this case, when the particles and the like are exposed to the dry etching gas, silver (Ag) in the intermediate layer of the pixel electrode 190 reacts with the etching gas to form silver oxide ($Ag_2O$), silver fluoride (AgF), or the like, and thus, silver oxide ($Ag_2O$), silver fluoride (AgF), or the like is included in the intermediate layer. Therefore, the electrical and light emitting characteristics of the organic light emitting diode display of the comparative example deteriorate.

However, since the etch stop layer 210 is disposed at an upper portion of an edge of the pixel electrode 190 according to the present exemplary embodiment, the pixel electrode 190 is not affected by the etching gas. In addition, since the etch stop layer 210 is formed of a compound having low reactivity with the etching gas, the etch stop layer 210 is not affected by the dry etching process.

Therefore, in the present exemplary embodiment, by including the etch stop layer 210, it is possible to prevent damage to the pixel electrode 190 in the dry etching process of forming the partition 370 and to prevent the electrical and light emitting characteristics of the organic light emitting diode display from deteriorating.

Figure 15:
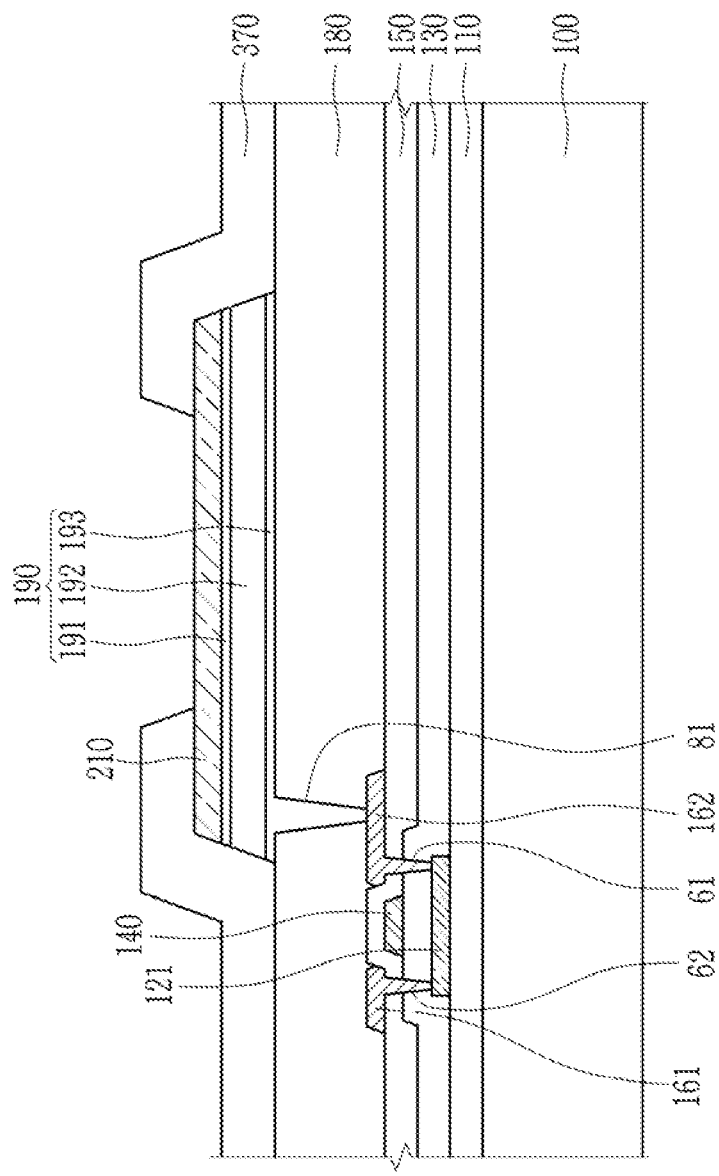

Referring to FIG. 15, the partition 370 is formed to expose a portion of the upper surface of the etch stop layer 210 in the organic light emitting diode display. Thereafter, a wet etching process is performed to pattern the etch stop layer 210.

Figure 16:
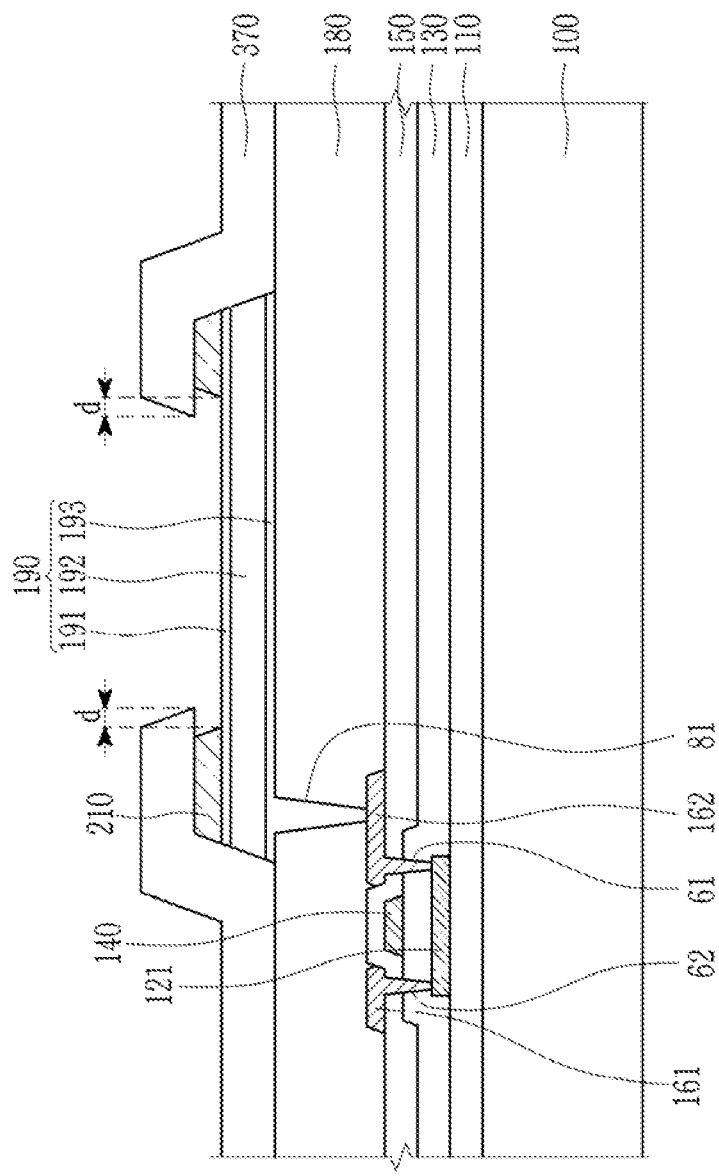

Referring to FIG. 16, the etch stop layer 210 is patterned to expose a portion of the upper surface of the pixel electrode 190 by a wet etching process.

Since the etch stop layer 210 includes a material having higher etching selectivity than that of the pixel electrode 190, only a portion of the upper surface of the etch stop layer 210 may be etched by the etchant. In addition, as described in FIG. 13, since the pixel electrode 190 including poly-ITO is also formed of a material having lower etching selectivity than that of the etch stop layer 210 by the heat treatment process, only the etch stop layer 210 is etched by the wet etching process.

In addition, the edge of the partition 370 is etched so that it protrudes more than the etch stop layer 210. In other words, the edge of the partition 370 extends beyond the edge of the etch stop layer 210. A distanced from one edge of the partition 370 to a first edge (or end) of the etch stop layer 210 may be 0.2 μm. In this case, the organic emission layer 350 may be flatly deposited on the upper surface of the pixel electrode 190.

Figure 17:
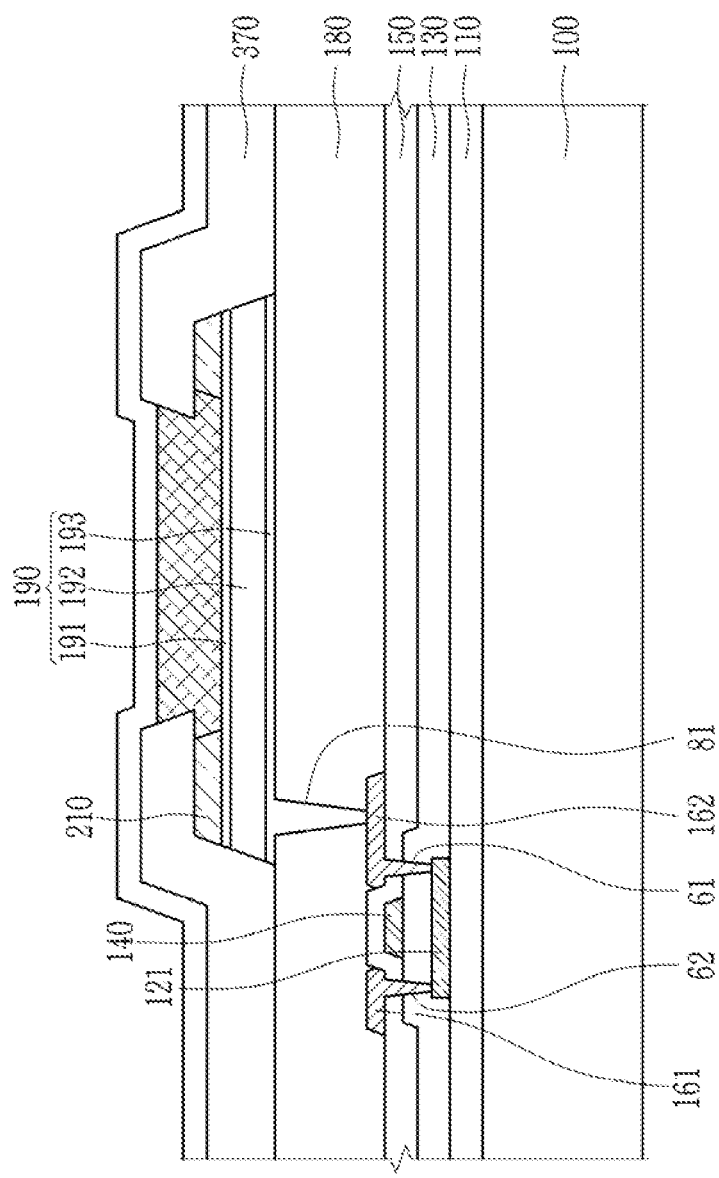

Referring to FIG. 17, as the etch stop layer 210 is etched, the organic emission layer 350 is disposed on the exposed upper surface of the pixel electrode 190, and the common electrode 270 is disposed on the organic emission layer 350 and the partition 370.

Therefore, in the present exemplary embodiment, by including the etch stop layer 210, it is possible to prevent damage to the pixel electrode 190 in the dry etching process of forming the partition and to prevent the electrical and light emitting characteristics of the organic light emitting diode display from deteriorating.

While this invention has been particularly shown and described with reference to exemplary embodiments thereof, it is to be understood by those skilled in the art that various modifications may be made thereto without departing from the spirit and scope of the present invention as set forth in the appended claims.

What is claimed is:

1. An organic light emitting diode display, comprising:
    a substrate;
    a thin film transistor disposed on the substrate;
    a planarization layer disposed on the thin film transistor;
    a pixel electrode disposed on the planarization layer, wherein the pixel electrode includes an upper layer and a lower layer including a transparent conductive oxide and an intermediate layer including silver;
    an etch stop layer disposed on the pixel electrode, wherein an upper surface of the pixel electrode is exposed by the etch stop layer;
    a partition disposed on the etch stop layer, wherein the upper surface of the pixel electrode is exposed by the partition;
    an organic emission layer disposed on the upper surface of the pixel electrode in an area where the upper surface of the pixel electrode is exposed by the etch stop layer and the partition; and
    a common electrode disposed on the organic emission layer and the partition,
    wherein the etch stop layer covers an edge and a side surface of the pixel electrode.

2. The organic light emitting diode display of claim 1, wherein the partition includes an inorganic material.

3. The organic light emitting diode display of claim 1, wherein the upper layer and the lower layer of the pixel electrode include a poly-indium tin oxide or an indium tin oxide.

4. The organic light emitting diode display of claim 1, wherein a thickness of the upper layer of the pixel electrode is 70 Å to 120 Å.

5. The organic light emitting diode display of claim 1, wherein the etch stop layer includes a compound having low reactivity with a fluorine-based gas.

6. The organic light emitting diode display of claim 5, wherein the etch stop layer includes an indium gallium zinc oxide.

7. The organic light emitting diode display of claim 1, wherein the planarization layer includes at least one of a polyimide, a polyamide, an acrylic resin, benzocyclobutene, and a phenol resin.

8. The organic light emitting diode display of claim 1, wherein the thin film transistor includes a semiconductor layer, a gat electrode, a source electrode, and a drain electrode, and the drain electrode is electrically connected to the pixel electrode.

9. An organic light emitting diode display, comprising
    a substrate;
    a thin film transistor disposed on the substrate;
    a planarization layer disposed on the thin film transistor;
    a pixel electrode disposed on the planarization layer, wherein the pixel electrode include an upper layer, an intermediate layer, and a lower layer;
    an etch stop layer disposed on the pixel electrode to expose an upper surface of the pixel electrode;
    a partition disposed on the etch stop layer to expose the upper surface of the pixel electrode;

an organic emission layer disposed on the upper surface of the pixel electrode, where the upper surface of the pixel electrode is exposed by the etch stop layer and the partition; and a common electrode disposed on the organic emission layer and the partition, wherein the intermediate layer of the pixel electrode includes silver, and the etch stop layer is disposed at an edge of the upper surface of the pixel electrode.

10. The organic light emitting diode display of claim 9, wherein the upper layer and the lower layer of the pixel electrode include a poly-indium tin oxide or an indium tin oxide.

11. The organic light emitting diode display of claim 9, wherein the partition includes an inorganic material.

12. The organic light emitting diode display of claim 9, wherein the etch stop layer includes a compound having low reactivity with a fluorine-based gas.

13. The organic light emitting diode display of claim 9, wherein the etch stop layer includes a material having a higher etching ratio than that of the pixel electrode.

14. The organic light emitting diode display of claim 9, wherein the thin film transistor includes a semiconductor layer, a gate electrode, a source electrode, and a drain electrode, and the drain electrode is electrically connected to the pixel electrode.

15. An organic light emitting diode display, comprising:
a substrate;
a thin film transistor disposed on the substrate;
a planarization layer disposed on the thin film transistor;
a pixel electrode disposed on the planarization layer, wherein the pixel electrode includes first, second and third layers stacked in sequence, wherein the first and third layers include a transparent conductive oxide and the second layer includes silver;
an etch stop layer disposed on an upper surface of the pixel electrode;
a partition disposed on the etch stop layer;
an organic emission layer disposed on a portion of the upper surface of the pixel electrode adjacent to the etch stop layer and the partition; and
a common electrode disposed on the organic emission layer and the partition,
wherein the etch stop layer covers an edge of the pixel electrode.

16. The organic light emitting diode display of claim 15, wherein the etch stop layer covers a side surface of the pixel electrode.

* * * * *